United States Patent [19]

Clough et al.

[11] Patent Number: 5,279,852
[45] Date of Patent: Jan. 18, 1994

[54] PROCESS FOR COATING A SUBSTRATE WITH COPPER OXIDE AND USES FOR COATED SUBSTRATES

[75] Inventors: Thomas J. Clough, Santa Monica; Victor L. Grosvenor, Topanga; Naum Pinsky, Thousand Oaks, all of Calif.

[73] Assignee: Ensci, Inc., Santa Monica, Calif.

[21] Appl. No.: 743,719

[22] Filed: Aug. 12, 1991

Related U.S. Application Data

[60] Continuation-in-part of Ser. No. 621,660, Dec. 3, 1990, Pat. No. 5,204,140, which is a continuation-in-part of Ser. No. 348,789, May 8, 1989, Pat. No. 5,167,820, which is a continuation-in-part of Ser. No. 348,788, May 8, 1989, Pat. No. 5,039,845, which is a continuation-in-part of Ser. No. 348,787, May 8, 1989, abandoned, which is a continuation-in-part of Ser. No. 348,786, May 8, 1989, Pat. No. 5,182,165, which is a continuation-in-part of Ser. No. 272,517, Nov. 17, 1988, abandoned, which is a continuation-in-part of Ser. No. 272,539, Nov. 17, 1988, abandoned, which is a continuation-in-part of Ser. No. 82,277, Aug. 6, 1987, Pat. No. 4,787,125, which is a division of Ser. No. 843,047, Mar. 24, 1986, Pat. No. 4,713,306.

[51] Int. Cl.$^5$ .............................................. B05D 5/12
[52] U.S. Cl. ................................. 427/126.3; 427/126.1; 427/126.2; 427/215; 427/216; 427/217; 427/376.2
[58] Field of Search .............. 427/126.3, 126.1, 126.2, 427/215, 216, 376.2, 217

[56] References Cited

PUBLICATIONS

"Measurements on thin-film high-$T_c$ superconductors," A. Kapitulnik, et al, IBM J. Res. Develop., vol. 33 No. 3, May 1989, pp. 252–261.
"USA: New Chemical Deposition Process Speeds Production of Thin–Film Superconductors," Engineering Digest Feb. 1990, pp. 11–14.
"Films of BSCCO superconductors prepared by spray pyrolysis of carboxylates," M. Schieber, et al, Cryogenica 1990 vol. 30 May, pp. 451–454.
"Forming $YBa_2CU_3O_{7-x}$ Superconductors on Copper Substrates," John F. Kennedy Space Center, NASA Tech Briefs, KSC-11448, pp. 1–28A.
"Fabrication and Evaluation of Superconducting Devices*," R. Babbitt, et al, Microwave Journal Apr. 1991, pp. 40–48.
"Comparison of Several CU(I) and CU(II) Precursors for the Sol-Gel Preparation of High $T_c$ Superconducting Metal Oxides," Mariquita A. Accibal, et al, Mat. Res. Soc. Symp. Proc. vol. 121 1988 Materials Research Society; pp. 401–406.
"Making High-Temperature Superconductors by Melt-Sintering," George C. Marshall Space Flight Center, NASA Tech Briefs MFS-26142, pp. 1–28.

Primary Examiner—James J. Bell
Attorney, Agent, or Firm—Frank J. Uxa, Jr.

[57] ABSTRACT

Processes for coating substrates, in particular substrates including shielded surfaces, with copper oxide-containing coatings are disclosed. Such processes comprise contacting a substrate with a copper oxide precursor, preferably maintaining the precursor coated substrate at conditions to equilibrate the coating, and then oxidizing the precursor to form a substrate containing copper oxide. Also disclosed are substrates coated with copper oxide-containing coatings for use in various applications.

27 Claims, 1 Drawing Sheet

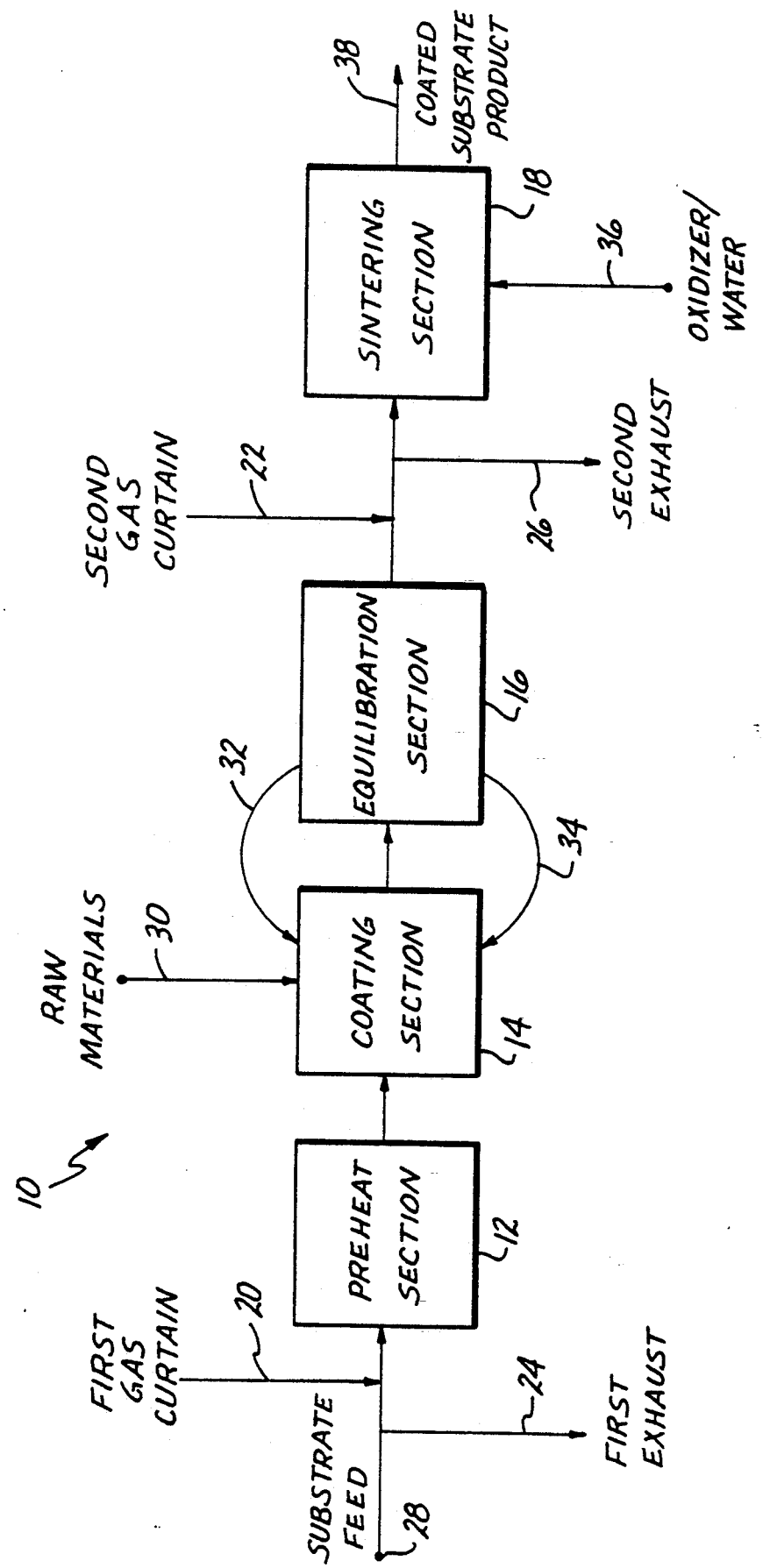

PROCESS FOR COATING A SUBSTRATE WITH COPPER OXIDE AND USES FOR COATED SUBSTRATES

RELATED APPLICATIONS

This application is a continuation in part of application Ser. No. 621,660 filed Dec. 3, 1990 now U.S. Pat. No. 5,204,140 which application in turn is a continuation-in-part of application Ser. Nos. 348,789 now U.S. Pat. No. 5,167,820; 348,788 U.S. Pat. No. 5,039,845; 348,787 and 348,786, U.S. Pat. No. 5,182,165 each filed May 8, 1989, each of which applications is a continuation-in-part of application Ser. Nos. 272,517 abandoned and 272,539 abandoned, each filed Nov. 17, 1988, each of which applications in turn, is a continuation-in-part of application Ser. No. 082,277, filed Aug. 6, 1987 (now U.S. Pat. No. 4,787,125) which application, in turn, is a division of application Ser. No. 843,047, filed Mar. 24, 1986, now U.S. Pat. No. 4,713,306. Each of these earlier filed applications and these U.S. Patents is incorporated in its entirety herein by reference.

BACKGROUND OF THE INVENTION

The present invention relates to a process for coating a substrate. More particularly, the invention relates to coating a substrate with an electrically conductive copper oxide-containing material, preferably an electrically super conductive copper oxide-containing material. More particularly, this invention relates to a new process for producing thin and thick superconductor films.

A number of techniques may be employed to provide conductive copper oxide coatings on inorganic substrates. For example, a high temperature sintering process may be employed. This process comprises contacting a substrate with an oxide source comprising for example a copper-oxide component, a yttrium oxide and barium oxide source material and contacting the components with an oxygen-containing vaporous medium at sintering temperature conditions effective to form the conductive copper oxide coating on the substrate.

However, superconductor materials are very difficult to work with, especially because of their brittleness. Once the material has undergone the sintering process, it is very difficult to from the material, particularly since the material is usually a ceramic typical of most superconductors.

Such superconducting materials in their finished states are extremely brittle, unmachineable and unbendable. Whatever form they are in after sintering is the form they stay in and little or no alterations have been developed.

Conventional superconducting materials, such as niobium-titanium and niobium-tin operate at liquid-helium temperatures (4.5 Kelvin) for cooling. New superconductors, currently under development, operate in liquid nitrogen, i.e. an expensive cryogenic fluid, at temperatures of 77 Kelvin or higher.

Conventional processing of copper oxide conductors, particularly for superconductors include:
(1) Substrate depositions, where ion beams are used on zirconium and sapphire substrates in various types of atmospheres. This method is presently being developed for microprocessor applicable films. A film is placed on to the flat surface, (not on a three dimensional surface) of a microprocessor ship; (2) Fiber (whisker) growth methods, which produce pure superconductor fibers using a laser heated growth method; and (3) extrusion.

A limitation of substrate deposition is the high cost of processing and expensive equipment required, i.e., sapphire substrates, ion beam deposition furnaces, lasers. However, the prior superconductor processes are still in an early stage of development due to the recent discoveries in copper oxide based superconductor.

One process undergoing development for applying a superconductor layer or material onto a copper wire, includes surrounding a copper wire with a yttrium-oxide and barium-carbonate powder pack. The powder is fired similar to other conventional methods of processing of bulk superconducting material.

During the process, the outer layer of the copper wire is oxidized producing a copper oxide layer around the wire. The yttrium and barium components react with this copper oxide by diffusion to produce a superconducting compound, a layer or an outer coating.

The results published to date showed a 5- to 10-micron layer (depending on firing time) of material in which all three of the constituent elements were present, as observed on the copper wire by a scanning electron microscope. Whether or not they were present consistently and continuously in the appropriate crystal from was not determined, but the Energy Dispersive Analysis indicated a correct element ratios.

It was also observed that the material could possibly be in patches or the crystals slightly removed from each other, thus disabling a continuous circuit. SEM analysis revealed the porous nature of the ceramic material and the agglomerated, grainy mix of the various phases within the material.

The conventional ceramic processing techniques have been adopted to prepare kilogram size powder batches and to fabricate bulk superconductors. In most cases, yttrium oxide, the oxide, peroxide, hydroxide or carbonate of barium and the oxide or carbonate of copper are used as precursors for the $YBa_2Cu_3O_x$ compound. Appropriate quantities of these precursor powders are mixed effectively by ball milling. Carbonates and oxides of yttrium, barium and copper have little solubility in water and are readily mixed in an aqueous vehicle.

Calcined powders can be formed into different shapes and configurations by various forming techniques including dry pressing, tape casting, screen printing and extrusion. The dry pressing method has been used to fabricate bulk superconducting parts with dimensions ranging from 90.1 to 20 c.m. Superconducting wires have been prepared by extrusion Superconducting ceramic tapes ($-20$ to 100 um thick) have been prepared by a tape casting technology similar to that used in fabrication of multilayer ceramic capacitors and ceramic packages for integrated circuits. Layers of superconducting and insulating tapes can be laminated to form multilayer device structure. Superconducting lines and pads have been prepared by the screen printing process. A viscous paste is first formed by mixing a superconducting powder with organic binders. The paste is then printed through a patterned finemeshed screen onto a substrate to form thick film superconducting patters having $-5$ to 20 um thickness.

The formed superconductor parts and circuit patterns are then fired at 900°–1000° C. to densify the ceramic. Later, proper oxidation anneal is usually necessary to provide a sufficient oxygen content for the required superconducting device properties.

Some factors are known to contribute to a better superconducting material and these factors include a higher density resulting in improved mechanical properties and a highly oriented texture in this films exhibiting a high critical current density.

Wires and cables of the ceramic materials are usually made from molded, extruded, or compressed polycrystalline powders. The flow of current between the polycrystalline grains is limited by boundaries between grains that act as "weak links" and the grains' directional anisotropy, or nonuniformity, with respect to current flow in the crystal. Current flow is impeded when it must follow a wandering path through randomly oriented grains. Aligning the grains can help to increase the current-carrying capacity of the ceramic material.

A significant problem with currently available thick oxide materials is their behavior in applied magnetic fields. Superconductors are either Type I or Type II materials. Both types exclude magnetic fields and are superconducting until a critical field level is reached. Above this level, Type I materials become nonsuperconducting. Type II materials, however, continue too superconduct, but allow magnetic flux to penetrate portions of the crystal lattice. Only when an upper critical field is reached do the Type II materials become nonsuperconducting. Most high-temperature superconductors are Type II materials.

Although the new superconductors have extremely high upper critical field limits, the "flux lattice," which is how the magnetic fields penetrate the superconductor, is unstable. Unless the flux lattice is "pinned," magnetic forces from circulating currents act on the magnetic field lines and cause the flux lattice to move. This movement, or flux creep, creates resistance to current flow.

It is generally believed that, because thin films of the materials can carry large currents, flux creep is not an intrinsic property of oxide superconductors material. There is a need to be able to manufacture film, particularly thin films and to be able to control boundaries between grains. There is a need to be able to manufacture film, particularly thin films and to be able to control boundaries between grains.

The above conventional sintering processes are examples of processes in which the oxides are generally formed first, particularly as powders, followed by sintering on flat and or smooth powder accessible surfaces.

There are significant limitations inherent in the prior art processes. For example the processes are generally based upon conventional ceramic processes and the use of oxide precursor powders and forming. Powders are consolidated themselves or deposited on a substrate followed by compaction and sintering. These limitations are particularly apparent for the processing of non-flat surfaces and where coating uniformly and reduced grain boundary deleterious effects are essential. For example, particularly with non-flat surfaces, portions of a substrate, particularly internal surfaces, which are shielded from the copper oxide powder e.g., such as pores which extend inwardly from the external surface and substrate layers which are internal at least partially shielded from the depositing copper oxide source by one or more other layers or surfaces closer to the external substrate surface being coated, or because of such external surfaces closer proximity to a source system do not get uniformly coated, if at all, in solid/solid type of sintering processes. Such shielded substrate portions either are not being contacted by the powder source during processing or are being contacted, if at all, not uniformly by the powder source during processing and/or the processing time required is excessive or the process not applicable to continuous productions.

Although the sintering process is useful for coating a single flat surface, for the reasons noted above this process tends to produce non-uniform and/or discontinuous coatings on three dimensional surfaces having inner shielded surface and/or the processing is difficult or time consuming. Such non uniformities and/or processing drawbacks are detrimental to the electrical and chemical properties of the coated substrate.

A new process, e.g., a "non-line-of-sight" or "three dimensional" process, useful for coating such substrates would be advantageous. As used herein, a "non-line-of-sight" or "three dimensional" process is a process which coats surfaces of a substrate with conductive copper oxide which surfaces would not be directly exposed to copper oxide-forming compounds being deposited on the external surface of the substrate during the first contacting step and/or which improves the overall processability to conductive component and article and/or type of substrate to be coated. In other words, a "three dimensional" process coats coatable substrate surfaces which are at least partially shielded by other portions of the substrate which are closer to the external surface of the substrate during processing, e.g., the surfaces of the internal fibers of a porous mat of ceramic fibers and/or improve the overall processability from a time and/or type of substrate processing standpoint.

SUMMARY OF THE INVENTION

A new process for at least partially coating a substrate with a copper oxide-forming material has been discovered. In brief, the process comprises contacting the substrate with a copper oxide precursor, for example, cuprous chloride, in a vaporous form and/or in a liquid form and/or in a solid (e.g., powder) form, to form a copper oxide precursor-containing coating, for example, a cuprous chloride-containing coating, on the substrate; preferably contacting the substrate with an additional conductivity forming component, i.e., a component containing for example a yttrium oxide, barium oxide precursor and/or oxide (as in a compound), to form a multi component-containing coating on the substrate; and contacting the coated substrate with an oxidizing agent to form a copper oxide-containing coating on the substrate. The contacting of the substrate with the copper oxide precursor and with the additional conductivity interacting component can occur together, i.e., simultaneously, and/or in separate steps. One of the preferred substrates for use as conductive particularly superconductors, fibers and particulate are metal and ceramic particulate and/or fibers in particular copper and magnesia and/or yttrium oxide stabilized zirconia particulate and/or fiber.

This process can provide coated substrates which have substantial electrical conductivity so as to be suitable for use as components in application for super conducting materials.. Substantial coating uniformity, e.g., in the thickness of the copper oxide-containing coating and in the distribution of the additional component in the coating, is obtained. Further, the present copper oxide coated substrates have outstanding stability, e.g., in terms of electrical properties and morphology, and are thus useful in various applications. In addition, the process is efficient in utilizing the materials which are employed to form the coated substrate.

DETAILED DESCRIPTION OF THE INVENTION

In one broad aspect, the present coating process comprises contacting a substrate with a composition comprising a copper oxide precursor, such as copper chloride forming components, including cupric chloride, cuprous chloride and mixtures thereof, preferably cuprous chloride, at conditions, preferably substantially non-deleterious oxidizing conditions, more preferably in a substantially inert environment or atmosphere, effective to form a copper oxide precursorcontaining coating, such as a cuprous chloride-containing coating, on at least a portion of the substrate. The substrate is preferably also contacted with at least one preferably two to three conductivity interacting components, such as at least one each of yttrium and barium oxide precursor and/or oxide components, at conditions, preferably substantially non-deleterious oxidizing conditions, more preferably in a substantially inert atmosphere, effective to form a multi component-containing coating, such as a 1,2,3 $Y, Ba_2, Cu_3O_7$ and/or a 1,2,4 component-containing coating, on at least a portion of the substrate. This substrate, including one or more coatings containing copper oxide precursor, for example copper chloride and preferably cuprous chloride, and such additional conductivity interacting components, are contacted with at least one oxidizing agent at conditions effective to convert the copper oxide precursor to copper oxide and form a copper oxide-containing, coating, preferably a yttrium, barium, copper oxide-containing 1,2,3 coating on at least a portion of the substrate. By "nondeleterious oxidation" is meant that the majority of the oxidation of copper oxide precursor, for example cuprous chloride, coated onto the substrate takes place in the oxidizing agent contacting step of the process, after distribution, and/or equilibration of the copper oxide precursor rather than in process step or steps conducted at non-deleterious oxidizing conditions. The process as set forth below will be described in many instances with reference to cuprous chloride, which has been found to provide particularly outstanding process and product properties. However, it is to be understood that other suitable copper oxide precursors are included within the scope of the present invention.

The additional conductivity interacting components in the coating as set forth above may be applied to the substrate before and/or after and/or during the time the substrate is coated with cuprous chloride. In a particularly useful embodiment, the cuprous chloride and the additional conductivity forming component are both present in the same composition used to contact the substrate so that the cuprous chloride-containing coating further contains such additional components. This embodiment provides processing efficiencies since the number of process steps is reduced (relative to separately coating the substrate with cuprous chloride and conductivity interacting component). In addition, the relative amount of cuprous chloride and conductivity interacting component used to coat the substrate can be effectively controlled in this "single coating composition" embodiment of the present invention.

In another useful embodiment, the substrate with the cuprous chloride-containing coating and the additional component-containing coating is maintained at conditions, preferably at substantially non-deleterious oxidizing conditions for example condition which allows for formation and/or distribution of a copper oxide precursor coating more uniformly on the substrate, for a period of time effective to do at least one of the following: (1) coat a larger portion of the substrate with cuprous chloride-containing coating; (2) distribute the cuprous chloride coating over the substrate; (3) make the cuprous chloride-containing coating more uniform in thickness; and (4) distribute the additional conductivity interacting components more uniformly in the cuprous chloride-containing coating. Such maintaining preferably occurs for a period of time in the range of about 0.1 minute to about 20 minutes in the presence of an inert gas or oxygen if air under substantially non deleterious oxidizing conditions is used. Such maintaining is preferably conducted at the same or a higher temperature relative to the temperature at which the substrate/cuprous chloridecontaining composition contacting occurs. Such maintaining, in general, acts to make the coating more uniform and, thereby, for example, provides for beneficial electrical conductivity properties. The thickness of the copper oxide-containing coating is preferably in the range of about 0.1 micron to about 100 microns, more preferably about 1.0 micron to about 10 microns.

The cuprous chloride which is contacted with the substrate is in a vaporous phase or state, or in a liquid phase or state, or in a solid state or phase (powder) at the time of the contacting. The composition which includes the cuprous chloride preferably also includes the conductivity interacting component or components. This composition may also include one or more other materials, e.g., dopants, catalysts, grain growth inhibitors, solvents, etc. crystallization control agents, which do not substantially adversely promote the premature hydrolysis oxidation of the cuprous chloride and/or the additional components, and do not substantially adversely affect the properties of the final product, such as by leaving a detrimental residue in the final product prior to the formation of the copper oxide-containing coating. Thus, it has been found to be important, e.g., to obtaining a copper oxide coating with good structural and/or electronic properties, that undue premature hydrolysis oxidation of the cuprous chloride and additional components be avoided.

It has also been found that the substrate can first be contacted with a copper oxide precursor powder, particularly cuprous chloride powder, preferably with a film forming amount of such powder, followed by increasing the temperature to the liquidus point of the powder on the substrate and maintaining the coated substrate for a period of time at conditions including the increased temperature effective to do at least one of the following: (1) coat a larger portion of the substrate with the copper oxide precursorcontaining coating; (2) distribute the coating over the substrate; and (3) make the coating more uniform in thickness. Preferably, this step provides for the equilibration of the coating on the substrate. The size distribution of the powder, for example, cuprous chloride powder, and the amount of such powder applied to the substrate are preferably chosen so as to distribute the coating over substantially the entire substrate.

The copper oxide precursor powder can be applied to the substrate as a powder, particularly in the range of about 5 or about 10 to about 125 microns in average particle size, the size in part being a function of the substrate particle size, i.e. smaller particles generally require smaller size powder. The powder is preferably applied as a charged fluidized powder, in particular having a charge opposite that of the substrate or at a temperature where the powder contacts and adheres to the substrate. In carrying out the powder coating, the coating system can be, for example, one or more electrostatic fluidized beds, spray systems having a fluidized chamber, and other means for applying powder, preferably in a film forming amount. The amount of powder used is generally based on the thickness of the desired coating and incidental losses that may occur during processing. The powder process together with conversion to a copper oxide-containing coating can be repeated to achieve desired coating properties, such as desired gradient conductivities.

Typically, the fluidizing gaseous medium is selected to be compatible with the copper oxide precursor powder, i.e., to not substantially adversely affect the formation of a coating on the substrate during melting and ultimate conversion to a copper oxide-containing film.

Generally, gases such as air, nitrogen, argon, helium and the like, can be used, with air being a gas of choice, where no substantial adverse prehydrolysis and or oxidation reaction of the powder precursor takes place prior to the oxidation-reaction to the copper oxide coating as previously discussed under equilibration and maintaining. The gas flow rate is typically selected to obtain fluidization and charge transfer to the powder. Fine powders require less gas flow for equivalent deposition. It has been found that small amounts of water vapor enhance charge transfer. The temperature of the powder precursor is generally in the range of about 0° C. to about 100° C., or higher more preferably about 20° C. to about 40° C., and still more preferably about ambient temperature. The substrate however can be at a temperature the same as or substantially higher than the powder.

The time for contacting the substrate with precursor powder is generally a function of the substrate bulk density, thickness, powder size and gas flow rate. The particular coating means is selected in part according to the above criteria, particularly the geometry of the substrate. For example, particles, spheres, flakes, short fibers and other similar substrate, can be coated directly in a fluidized bed themselves with such substrates being in a fluidized motion or state. For fabrics, single fibers and rovings or tows a preferred method is to transport the fabric and/or roving directly through a fluidized bed for powder contacting. In the case of rovings, and tows a fiber spreader can be used which exposes the filaments within the fiber bundle to the powder. The powder coating can be adjusted such that all sides of the substrate fabric, roving and the like are contacted with powder. Typical contacting time can vary from seconds to minutes, preferably in the range of about 1 second to about 120 seconds, more preferably about 2 seconds to about 30 seconds.

Typical copper oxide precursor powders are those that are powders at powder/substrate contacting conditions and which are liquidus at the maintaining conditions, preferably equilibration conditions, of the present process. It is preferred that the powder on melting substantially wets the surface of the substrate, preferably having a low contact angle formed by the liquid precursor in contact with the substrate and has a relatively low viscosity and low vapor pressure at the temperature conditions of melting and maintaining, preferably melting within the range of about 100° C. to about 650° C., more preferably about 435° C. to about 630° C. Typical powder copper oxide precursors are cuprous chloride, cuprous oxide low molecular weight organic salts or complexes of copper, particularly low molecular weight organic salts and complexes including poly functional/carboxyl, hydroxyl and ketone such as cuprous acetate and acetylacetonate complexes of copper.

An additional component powder, such as the conductivity forming additional powders, can be combined with the copper oxide precursor powder. The particularly preferred additional powders are yttrium chloride and/or oxide, barium carbonate and/or oxide or peroxide. Further, additional components can be incorporated into the coating during the maintaining step, for example a gas as a source of such additional component. A combination of the two methods can also be used for additional component incorporation.

As set forth above, the copper oxide presursor powders and additional component conductivity interacting component can produce a film forming amount precursor component on the substrate, particularly distribution of the film over a substantial part of said substrate, followed by oxidation. In addition to the precursor components set forth above, nitrates, sulfates and their hydrates, as well as the hydrator of for example chloride, can be selected and used within the processing requirements for producing such conductive films.

The powder copper oxide precursor on melting is maintained and/or equilibrated as set forth above. In addition, temperatures can be adjusted and/or a component introduced into the melting/maintaining step which can aid in altering the precursor for enhanced conversion to copper oxide. For example, gaseous hydrogen chloride can be introduced to form partial or total halide salts and/or the temperature can be adjusted to enhance decomposition of, for example, copper organic salts and/or complexes to more readily oxidizable copper compounds. The additional interacting component can also be present as an oxide precursor or in the melt as a dispersed preferably as a finely dispersed solid. The oxide can be advantageously incorporated as part of the substrate powder coating.

A fluidizable coated substrate, such as substrates coated directly in a fluid bed of powder, can be subjected to conditions which allow liquidus formation by the copper oxide precursor and coating of the substrate. A particularly preferred process uses a film forming amount of the copper oxide precursor which allows for coating during the liquidus step of the process, and which substantially reduces detrimental substrate agglomeration. The conditions are adjusted or controlled to allow substantially free substrate fluidization and transport under the conditions of temperature and bed density, such as dense bed density to lean bed density. The coated substrate can be further transported to the oxidation step for conversion to copper oxide. A particularly preferred embodiment is the transport of the liquidus coated substrate as a dense bed to a fluidized oxidation zone, such zone being a fluidized zone preferably producing a conversion to copper oxide on the substrate of at least about 60% by weight, preferably about 80% by weight.

The cuprous chloride and/or conductivity interacting component to be contacted with the substrate may be present in a molten state. For example, a melt containing molten cuprous chloride and/or additional components may be used. The molten composition may include one or more other materials, having properties as noted above, to produce a mixture, e.g., a eutectic mixture, having a reduced melting point and/or boiling point. The use of molten cuprous chloride and/or additional component provides advantageous substrate coating while reducing the handling and disposal problems caused by a solvent. In addition, the substrate is very effectively and efficiently coated so that coating material losses are reduced.

The cuprous chloride and/or dopant-forming component to be contacted with the substrate may be present in a vaporous and/or atomized state. As used in this context, the term "vaporous state" refers to both a substantially gaseous state and a state in which the cuprous chloride and/or additional component are present as drops or droplets and/or mist and/or solid dispersions such as colloidal dispersion in a carrier gas, i.e., an atomized state. Liquid state cuprous chloride and/or additional component may be utilized to generate such vaporous state compositions.

In addition to the other materials, as noted above, the composition containing cuprous chloride and/or the conductivity interacting component may also include one or more grain growth inhibitor and/or crystallization control components. Such inhibitor component or components are present in an amount effective to inhibit grain growth or provide optimum crystal orientation in the copper oxide-containing coating. Reducing grain growth and providing optimum crystal orientation leads to beneficial coating properties, e.g., higher electrical conductivity, more uniform morphology, and/or greater overall stability. Among useful grain growth inhibitor components are components which include at least one metal, in particular calcium, magnesium, silicon and mixtures thereof. Of course, such grain growth inhibitor components should have no substantial detrimental effect on the final product.

The additional components may be deposited on the substrate separately from the cuprous chloride, e.g., before and/or during and/or after the cuprous chloride/substrate contacting. If the additional component is deposited on the substrate separately from the cuprous chloride, it is preferred that the additional component, for example, the conductivity interacting oxide precursor component, be deposited before the cuprous chloride.

Any suitable conductivity compatible and/or enhancing component may be employed in the present process. Such conductivity interacting component should provide sufficient stoichiometry so that the final copper oxide coating has the desired properties, e.g., electronic conductivity, stability, etc. Chloride, nitrate, sulfate, organic complexes as set forth above and their hydrate components are particularly useful additional components with oxide, peroxide and carbonates being also useful. Care should be exercised in choosing the additional component or components for use. For example, the components should be sufficiently compatible with the cuprous chloride so that the desired conductive copper oxide coating can be formed. Additional components which have excessively high boiling points and/or are excessively volatile (relative to cuprous chloride), at the conditions employed in the present process, are not preferred since, for example, the final coating may not have requisite stoichiometry and/or a relatively large amount of the additional component or components may be lost during processing. It may be useful to include one or more property altering components, e.g., boiling point depressants, in the composition containing the additional component to be contacted with the substrate. Such property altering component or components are included in an amount effective to alter one or more properties, e.g., boiling point, of the additional component, e.g., to improve the compatibility or reduce the incompatibility between the additional component and cuprous chloride.

The use of an additional component is an important feature of certain aspects of the present invention. First, it has been found that such components can be effectively and efficiently incorporated into the copper oxide-containing coating. In addition, such additional components act to provide copper oxide containing coatings with excellent electronic properties referred to above, morphology and stability.

The liquid, e.g., molten, composition which includes cuprous chloride may, and preferably does, also include one or more additional components. In this embodiment, the additional component or components are preferably soluble and/or dispersible in the composition. Atomized mixtures of cuprous chloride and additional components may also be used. Such compositions are particularly effective since the amount of additional component in the final copper oxide coating can be controlled by controlling the make-up of the composition. In addition, both the cuprous chloride and additional component are deposited on the substrate in one step. Moreover, if cuprous chloride and yttrium chloride, and a barium oxide precursor (dispersed) are used, such components provide the conductivity stoichiometry and are converted to copper oxide during the oxidizing agent/substrate contacting step. This enhances the overall utilization of the coating components in the present process. Particularly useful compositions produce a yttrium to barium to copper oxide ratio of 1,2,3 or 1,2,4.

As set forth above, a preferred close of superconductors are the 1, 2, 3 and 1, 2, 4 superconductors of yttrium, barium and copper. In addition, thallium, barium Ca and copper oxide in an atomic weight ratio of about 2, 2, 2,$^3$ are also preferred. Bismuth based copper oxide conductors are further examples of conductors within the scope of this invention. The films prepared by the process of this invention enhance the current carrying capability of the conductors, can reduce grain boundary current carry effects or provide improved control of oxidation and/or annealing conditions and uniformity, including the requisite atomic weight stoichiometry.

The substrates can vary widely as set forth above and under the substrate description for application within the scope of this invention, such as under catalysts applications. Typical examples of additional supports which find usefulness in the process and products of this invention include silver, nickel, copper, alumina, including sapphire, alumina silicate, alumina silica, alumina silica boria, beryllia, magnesia, magnesium alumina silicate and other spinels, yttria, magnesia and zirconia, stabilized zirconia, fosterite, silicon carbide and nitride and sialon. As set forth above, supports which can produce substantially detrimental interference and/or reaction with the film can be used in combination with means to reduce such effects, such as barrier conductive films prior to processing of the conduction films.

In one embodiment, a "vaporous" cuprous chloride composition is utilized to contact the substrate, and the composition is at a higher temperature than is the substrate. The make-up of the vaporous cuprous chloride-containing composition is such that cuprous chloride condensation occurs on the cooler substrate. If one or more additional components are present in the composition, it is preferred that such additional components also contact the substrate. The amount of condensation can be controlled by controlling the chemical make-up of the vaporous composition and the temperature differential between the composition and the substrate. This "condensation" approach very effectively coats the substrate to the desired coating thickness without requiring that the substrate be subjected to numerous individual or separate contactings with the cuprous chloride-containing composition.

The substrate including the cuprous chloridecontaining coating and the conductivity interacting component-containing coating is contacted with an oxidizing agent at conditions effective to convert cuprous chloride to copper oxide, and form a copper oxide coating on at least a portion of the substrate. Water, e.g., in the form of a controlled amount of humidity, can be present during the coated substrate/oxidizing agent contacting provided that substantial deleterious changes in final copper oxide preferably are controlled and/or minimized. The presence of water during this contacting has been found to provide a conductive copper oxide coating having excellent electrical conductivity properties.

Any suitable oxidizing agent may be employed, provided that such agent functions as described herein. Preferably, the oxidizing agent (or mixtures of such agents) is substantially gaseous at the coated substrate/oxidizing agent contacting conditions. The oxidizing agent preferably includes reducible oxygen, i.e., oxygen which is reduced in oxidation state as a result of the coated substrate/oxidizing agent contacting. More preferably, the oxidizing agent comprises molecular oxygen, either alone or as a component of a gaseous mixture, e.g., air.

The substrate may be composed of any suitable material and may be in any suitable form. Preferably, the substrate is such so as to minimize or substantially eliminate detrimental substrate coating reaction and/or migration of ions and other species, if any, from or by the substrate to the copper oxidecontaining coating which are deleterious to the functioning or performance of the coated substrate in a particular application. However, controlled substrate reaction which provides the requisite stoichiometry can be used and such process is within the scope of this invention. In addition, the substrate can be precoated to minimize migration, for example an aluminum or silica precoat and/or to improve wetability and uniform distribution of the coating materials on the substrate. Further the copper oxide component article can be further coated with a barrier film, organic and/or inorganic to minimize reaction of components such as corrosive gaseous components with the final copper oxide components article. In order to provide for controlled electrical superconductivity in the copper oxide coating, it is preferred that the substrate be substantially non-deleterious reactive with the copper oxide coating, such as to not change superconductive to conductive properties. In the preferred embodiment, the substrate is inorganic, for example metal and/or ceramic. Although the present process may be employed to coat two dimensional substrates, such as substantially flat surfaces, it has particular applicable to coating three dimensional substrates. Thus, the present process provides substantial process advances as a three dimensional process. Examples of three dimensional substrates which can be coated using the present process include spheres, such as having a diameter of from about 1 micron to about 500 microns preferably about 10 microns to about 150 microns, extrudates, flakes, single fibers, fiber rovings, chopped fibers, fiber mats, porous substrates, irregularly shaped particles, e.g., catalyst supports, multi-channel monoliths, tubes, conduits and the like. Ceramic and metal fibers, especially continuous fibers, are particularly useful substrates when the copper oxide coated substrate is to be used as a superconductor.

The conditions at which each of the steps of the present process occur are effective to obtain the desired result from each such step and to provide a substrate coated with a copper oxide-containing coating. The substrate/cuprous chloride contacting and the substrate/additional component contacting preferably occur at a temperature in the range of about 435° C. to about 630° C., more preferably about 450° C. to about 500° C. The amount of time during which cuprous chloride and/or dopant-forming component is being deposited on the substrate depends on a number of factors, for example, the desired thickness of the copper oxide-containing coating, the amounts of cuprous chloride and additional components available for substrate contacting, the method by which the cuprous chloride and additional components are contacted with the substrate and the like. Such amount of time is preferably in the range of about 0.5 minutes to about 20 minutes, more preferably about 1 minute to about 10 minutes.

If the coated substrate is maintained in a substantially non-deleterious oxidizing environment, as previously set forth it is preferred that such maintaining occur at a temperature in the range of about 435° C. to about 630° C., more preferably about 450° C. to about 500° C. for a period of time in the range of about 0.1 minutes to about 20 minutes, more preferably about 1 minute to about 10 minutes. The coated substrate/oxidizing agent contacting preferably occurs at a temperature in the range of about 500° C. to about 900° C., more preferably about 700° C. to about 850° C., for a period of time in the range of about 1 minute or up to about 4 hours. Additional contacting, i.e. annealing, of from about 450° C. up to about 650° C. can be used to develop optimum conductor properties. A particular advantage of the process of this invention is that the temperatures used for oxidation have been found to be lower, in certain cases, significantly lower, i.e., 50° to 100° C. or even up to 200° C. than the temperatures required for conventional sintering. This is very significant and unexpected, provides for process efficiencies and reduces, and in some cases substantially eliminates, deleterious reactions and/or migration of deleterious elements from the substrate to the copper oxide layer. Excessive reaction and/or migration, e.g., from or by the substrate, can reduce electronic conductivity depending on the substrate processing conditions. In addition, the oxidizing and/or sintering steps can be combined with a staged oxygen annealing step to develop optimum properties for example low to high or high to low concentrations of oxygen.

The pressure existing or maintained during each of these steps may be independently selected from elevated pressures (relative to atmospheric pressure), atmospheric pressure, and reduced pressures (relative to atmospheric pressure). Slightly reduced pressures, e.g., less than atmospheric pressure and greater than about 8 psia and especially greater than about 11 psia, are preferred.

The potential applications for superconducting materials include large-scale, passive application such as shields or waveguides, superconductors screen or reflect electromagnetic radiation and uses range from coatings on microwave cavities to shielding against electromagnetic pulses and bearings. Repulsive forces of superconductors excluding magnetic fields provide for noncontact bearings.

In addition, high-current, high-field, applications include magnetic imaging/scientific equipment, such as, Superconducting magnets for nuclear magnetic resonance and imaging spectrometers and particle accelerators; Magnetic separation, such as, magnets used for separation and purification of steel scrap, clays, ore streams, stack gases, and desulfurizing coal.

Magnetic levitation such as high-speed train systems; electromagnetic launch systems which can accelerate objects at high velocity. Possible uses include rapidly repeatable, i.e., earth satellite launching, aircraft catapults, and small guns for military uses.

Other magnet applications include powerful magnets in compact synchrotrons for electronic thin-film lithography, crystal growth, magnetohydrodynamic energy conversion systems, and ship propulsion by superconducting motors or by electromagnetic fields. Other high current high field applications include electric power transmission, such as, transmission cables, carrying more current than conventional conductors without loss. Such conductors must be mechanically rugged and operate under high field and high current conditions; energy storage, such as, large superconducting magnetic coils buried in the ground that can store vast amounts of electrical energy, without power loss, in persistent, circulating currents; load leveling for utilities and as power sources for military systems such as pulsed lasers; generators and motors, such as, low-temperature system operating with liquid helium. Motors can be used in ship propulsion, railway engines, and helicopters.

In the area of electronics; applications include passive devices, such as, high-speed wire interconnects in electronic circuits. digital devises, such as, superconducting components, based on Josephson junctions, to be used as switches or in computer logic and memory. In addition, the potential for hybridized semiconductor/superconductor electronic devices may provide yet unknown applications and devices; sensors, such as, superconducting quantum interference devices, SQUIDs) made from Josephson junctions which are extremely sensitive detectors of electromagnetic signals. Low-temperature SQUIDs are used in biomedical, geophysical, and submarine or airplane detection, infrared and microwave sensors.

Other devices include analog-to-digital convertors, voltage standards, signal processors, microwave mixers, filters, and amplifiers.

The copper oxide coated substrate, such as the 1,2,3 and 1,2,4 copper oxide coated substrate, of the present invention may be, for example, a component itself or a component of a composite together with one or more matrix materials. The composites may be such that the matrix material or materials substantially totally encapsulate or surround the coated substrate, or a portion of the coated substrate may extend away from the matrix material or materials.

Any suitable matrix material or materials may be used in a composite with the copper oxide coated substrate. Preferably, the matrix material comprises a polymeric material, e.g., one or more synthetic polymers, more preferably an organic polymeric material. The polymeric material may be either a thermoplastic material or a thermoset material. Among the thermoplastics useful in the present invention are the polyolefins, such as polyethylene, polypropylene, polymethylpentene and mixtures thereof; and poly vinyl polymers, such as polystyrene, polyvinylidene difluoride, combinations of polyphenylene oxide and polystyrene, and mixtures thereof. Among the thermoset polymers useful in the present invention are epoxies, phenol-formaldehyde polymers, polyesters, polyvinyl esters, polyurethanes, melamine-formaldehyde polymers, and urea-formaldehyde polymers.

In order to provide enhanced bonding between the copper oxide coated substrate and the matrix material, it has been found that the preferred matrix materials have an increased polarity, as indicated by an increased dipole moment, relative to the polarity of polypropylene. Because of weight and strength considerations, if the matrix material is to be a thermoplastic polymer, it is preferred that the matrix be a polypropylene-based polymer which includes one or more groups effective to increase the polarity of the polymer relative to polypropylene. Additive or additional monomers, such as maleic anhydride, vinyl acetate, acrylic acid, and the like and mixtures thereof, may be included prior to propylene polymerization to give the product propylene-based polymer increased polarity. Hydroxyl groups may also be included in a limited amount, using conventional techniques, to increase the polarity of the final propylene-based polymer.

Thermoset polymers which have increased polarity relative to polypropylene are more preferred for use as the present matrix material. Particularly preferred thermoset polymers include epoxies, phenol-formaldehyde polymers, polyesters, and polyvinyl esters.

Various techniques, such as casting, molding and the like, may be used to at least partially encapsulate or embed the copper oxide coated substrate into the matrix material or materials and form composites. The choice of technique may depend, for example, on the type of matrix material used, the type and form of the substrate used and the specific application involved.

In yet another embodiment, a coated substrate including copper oxide, i.e. electronically conductive copper oxide, and at least one additional catalyst component in an amount effective to promote a chemical reaction is formed. Preferably, the additional catalyst component is a metal and/or a component of a metal effective to promote the chemical reaction. The promoting effect of the catalyst component may be enhanced by the presence of an electrical field or electrical current in proximity to the component. Thus, the copper oxide, preferably on a substantially non-electronically conductive substrate, e.g., a catalyst support, can provide an effective and efficient catalyst for chemical reactions, including those which occur or are enhanced when an electric field or current is applied in proximity to the catalyst component. Thus, it has been found that the present coated substrates are useful as active catalysts and supports for additional catalytic components. Without wishing to limit the invention to any particular theory of operation, it is believed that the outstanding stability, e.g., with respect to electronic properties and/or morphology and/or stability, of the present copper oxides plays an important role in making useful and effective catalyst materials particularly the higher surface area attainable of copper oxide materials prepared in accordance with this invention, especially when compared to prior art sintering processes. Any chemical reaction, including a chemical reaction the rate of which is enhanced by the presence of an electrical and/or magnetic field or electrical current as described herein, may be promoted using the present catalyst component copper oxide-containing coated substrates. A particularly useful class of chemical reactions are those involving chemical oxidation or reduction. Chemical reactions, e.g., selective oxidation, dehydrogenation, such as alkylaromatics to olefins and olefins to dienes, hydrodecyclization, isomerization, ammoxidation, such as with olefins, aldol condensations using aldehydes and carboxylic acids and the like, selective methane oxidation, to methanol and/or ethane/ethylene may be promoted using the present catalyst component, copper oxide-containing coated substrates. It is believed that process severity is reduced with these catalysts.

Particularly useful chemical reactions as set forth above include the oxidative dehydrogenation of ethylbenzene to styrene and 1-butene to 1,3-butadiene; the ammoxidation of propylene to acrylonitrile; aldol condensation reactions for the production of unsaturated acids, i.e., formaldehyde and propionic acid to form methacrylic acid and formaldehyde and acetic acid to form acrylic acid; the isomerization of butenes; and the oxidation of methane to methanol.

The copper oxide-containing coated substrates of the present invention may be employed alone or as a catalyst and/or support in a sensor, in particular gas sensors. Preferably, the coated substrates includes a sensing component similar to the catalyst component, as described herein. The present sensors are useful to sense the presence or concentration of a component, e.g., a gaseous component, of interest in a medium, for example, hydrogen, carbon monoxide, methane and other alkanes, alcohols, aromatics, e.g., benzene, water, etc., e.g., by providing a signal in response to the presence or concentration of a component of interest, e.g., a gas of interest, in a medium. Such sensors are also useful where the signal provided is enhanced by the presence of an electrical field or current in proximity to the sensing component. The sensing component is preferably one or more metals or metallic containing sensing components, for example, platinum, palladium, silver and zinc. The signal provided may be the result of the component of interest itself impacting the sensing component and/or it may be the result of the component of interest being chemically reacted, e.g., oxidized or reduced, in the presence of the sensing component.

Any suitable catalyst component (or sensing component) may be employed, provided that it functions as described herein. Among the useful metal catalytic components and metal sensing components are those selected from components of the transition metals, the rare earth metals, certain other catalytic components and mixtures thereof, in particular catalysts containing gold, silver, copper, vanadium, chromium, tungsten, zinc, indium, antimony, the platinum group metals, i.e., platinum, palladium, iron, nickel, manganese, cesium, titanium, etc. Although metal containing compounds may be employed, it is preferred that the metal catalyst component (and/or metal sensing component) included with the coated substrate comprise elemental metal and/or metal in one or more active oxidized forms, for example, $Cr_2O_3$, $Ag_2O$, $Sb_2O_4$, etc.

The preferred support materials include a wide variety of materials used to support catalytic species, particularly porous refractory inorganic oxides These supports include, for example, alumina, zirconia, magnesia, boria, phosphate, titania, ceria, thoria and the like, as well as multi-oxide type supports such as alumina-phosphorous oxide, silica alumina, zeolite modified inorganic oxides, e.g., silica alumina, and the like. As set forth above, support materials can be in many forms and shapes, especially porous shapes which are not flat surfaces, i.e., non line-of-site materials. A particularly useful catalyst support is a multi-channel monoliths such as made from corderite which has been coated with alumina. The catalyst materials can be used as is or further processed such as by sintering of powered catalyst materials into larger aggregates. The aggregates can incorporate other powders, for example, other oxides, to form the aggregates.

The catalyst components (or sensing components) may be included with the coated substrate using any one or more of various techniques, e.g., conventional and well known techniques. For example, metal catalyst components (metal sensing components) can be included with the coated substrate by impregnation; electrochemical deposition; deposition from a molten salt mixture; thermal decomposition of a metal compound or the like. The amount of catalyst component (or sensing component) included is sufficient to perform the desired catalytic (or sensing function), respectively, and varies from application to application. In one embodiment, the catalyst component (or sensing component) is incorporated while the copper oxide is placed on the substrate. Thus, a catalyst material, such as a salt or acid, e.g., a halide and preferably chloride, oxy chloride and chloro acids, e.g., chloro platinic acid, of the catalytic metal, is incorporated into the cuprous chloride-containing coating of the substrate, prior to contact with the oxidizing agent, as described herein. This catalyst material can be combined with the cuprous chloride and contacted with the substrate, or it may be contacted with the substrate separately from cuprous chloride before, during and/or after the cuprous chloride/substrate contacting.

The preferred approach is to incorporate catalyst-forming materials into a process step used to form a copper oxide coating. This minimizes the number of process steps but also, in certain cases, produces more effective catalysts. The choice of approach is dependent on a number of factors, including the process compatibility of copper oxide and catalyst-forming materials under given process conditions and the overall process efficiency and catalyst effectiveness.

The copper oxide/substrate combinations, e.g., the copper oxide coated substrates, of the present invention are useful in other applications as well. Among these other applications are included porous membranes, resistance heating elements, electrostatic dissipation elements, electromagnetic interference shielding elements, protective coatings and the like.

In one embodiment, a porous membrane is provided which comprises a porous substrate, preferably an inorganic substrate, and a copper oxide-containing material in contact with at least a portion of the porous substrate. In another embodiment, the porous membrane comprises a porous organic matrix material, e.g., a porous polymeric matrix material, and a copper oxide containing material in contact with at least a portion of the porous organic matrix material. With the organic matrix material, the copper oxidecontaining material may be present in the form of an inorganic substrate, porous or substantially non porous, having a copper oxide-containing coating, e.g., an electronically conductive copper oxide-containing coating, thereon including such substrates set forth above under forms, shapes, and catalyst supports.

One particularly useful feature of the present porous membranes is the ability to control the amount of copper oxide present to provide for enhanced performance in a specific application, e.g., a specific contacting process. For example, the thickness of the copper oxide-containing coating can be controlled to provide such enhanced performance. The coating process of the present invention is particularly advantageous in providing such controlled coating thickness. Also, the thickness of the copper oxide-containing coating can be varied, e.g., over different areas of the same porous membrane, such as an asymmetric porous membrane. In fact, the thickness of this coating can effect the size, e.g., diameter, of the pores. The size of the pores of the membrane or porous substrate may vary inversely with the thickness of the coating. The coating process of the present invention is particularly useful in providing this porosity control.

In addition, an electrostatic dissipation/electromagnetic interference shielding element is provided which comprises a three dimensional substrate, e.g., an inorganic substrate, having an electronically conductive copper oxide-containing coating on at least a portion of all three dimensions thereof. The coated substrate is adapted and structured to provide at least one of the following: electrostatic dissipation and electromagnetic interference shielding including majestic shielding application as set forth above.

A very useful application for the products of this invention is for static, for example, electrostatic, dissipation and shielding, particularly for ceramic and polymeric parts, and depending on the reflection absorption required on metallic parts and more particularly as a means for effecting dissipation including controlled static charge and dissipation and/or magnetic/electric field absorption in parts, such as parts made of ceramics and polymers and the like, as described herein. The present products can be incorporated directly into the polymer or ceramic and/or a carrier such as a cured or uncured polymer based carrier or other liquid, as for example in the form of a liquid, paste, hot melt, film and the like. These product/carrier based materials can be directly applied to parts to be treated to improve overall performance effectiveness. A heating cycle can be used to provide for product bonding to the parts.

The particular form of the products, i.e., fibers, i.e., short and continuous, flakes, particles, mats or the like, is chosen based upon the particular requirements of the part and its application, with one or more of flakes, fibers and particles, including spheres, being preferred for polymeric and sintered in organic parts. In general, it is preferred that the particle type products of the invention have a largest dimension, for example, the length of fiber or particle or side of a flake, of less than about ⅛ inch, more preferably less than about 1/64 inch and still more preferably less than about 1/128 inch. It is preferred that the ratio of the longest dimension, for example, length, side or diameter, to the shortest dimension of the products of the present invention be in the range of about 500 to 1 to about 10 to 1, more preferably about 250 to 1 to about 25 to 1. The concentration of such product or products in the product/carrier and/or mix is preferably less than about 60 weight %, more preferably less than about 40 weight %, and still more preferably less than about 20 weight %. A particularly useful concentration is that which provides the desired performance while minimizing one concentration of product in the final article, device or part.

The present copper oxide/substrate combinations and matrix material/copper oxide/substrate combinations, which have at least some degree of porosity, hereinafter referred to as "porous contacting membranes" or "porous membranes", may be employed as active components and/or as supports for active components in systems in which the copper oxide/substrate, e.g., the copper oxide coated substrate, is contacted with one or more other components such as in, for example, separation systems, gas purification systems, filter medium systems, flocculent systems and other systems in which the conducting stability and durability of such combinations can be advantageously utilized, especially super conductivity at the temperatures below the Tc of the copper oxide material. The particular matrix and it's mechanical properties are selected for operation at the Tc of the super conductor.

Particular applications which combine many of the outstanding properties of the products of the present invention include magnetic separations, porous and electro membrane separations for particle processing, metallurgical separation, chemical processing, bio medical processing and particle separation. For example, various types of solutions can be further concentrated, e.g., latex concentrated, proteins isolated, colloids removed, salts removed, etc. The separation devices including membranes can be used in flat plate, tubular and/or spiral wound system design.

Membranes containing voids that are large in comparison with molecular dimensions are considered porous. In these porous membranes, the pores are interconnected, and the membrane may comprise only a few percent of the total volume. Transport, whether driven by pressure, concentration, or electrical potential or field, occurs within these pores. Many of the transport characteristics of porous membranes are determined by the pore structure, with selectivity being governed primarily by the relative size of the molecules or particles involved in a particular application compared to the membrane pores. Mechanical properties and chemical resistance are greatly affected by the nature, composition and structure e.g., chemical composition and physical state, of the membrane.

Commercial micropore membranes have pore dimensions, e.g., diameters, in the range of about 0.005 micron to about 20 microns. They are made from a wide variety of materials in order to provide a range of chemical and solvent resistances. Some are fiber or fabric reinforced to obtain the required mechanical rigidity and strength. The operational characteristics of the membrane ar defined sometimes in terms of the molecules or particles that will pass through the membrane pore structure.

Microporous membranes are often used as filters. Those with relatively large pores are used in separating coarse disperse, suspended substances, such as particulate contamination. Membranes with smaller pores are used for sterile filtration of gases, separation of aerosols, and sterile filtration of pharmaceutical, biological, and heat sensitive solutions. The very finest membranes may be used to separate, e.g., purify, soluble macromolecular compounds.

Porous membranes also are used in dialysis applications such a removing waste from human blood (hemodialysis), for separation of biopolymers, e.g., with molecular weights in the range of about 10,000 to about 100,000, and for the analytical measurements of polymer molecular weights. Microporous membranes also may be used as supports for very thin, dense skins or a containers for liquid membranes.

The ability of dense membranes to transport species selectively makes possible molecular separation processes such as desalination of water or gas purification, but with normal thicknesses these rates are extremely slow. In principle, the membranes could be made thin enough that the rates would be attractive, but such thin membranes would be very difficult to form and to handle, and they would have difficulty supporting the stresses imposed by the application. Conversely, microporous membranes have high transport rates but very poor selectivity for small molecules. Asymmetric membranes, for example made of the present combinations, in which a very thin, dense membrane is placed in series with a porous substructure are durable and provide high rates with high selectivity. Such asymmetric membranes and the use thereof are within the scope of the present invention.

Examples of applications for porous membranes include: separation of fungal biomass particle removal from hot coal gasification products; desalination of sea water; enhancement of catecholamine determination; removal of colloids from high purity deionized water; filtration of tissue homogenates; separation of antigen from antigen-antibody couple in immunoassay; purification of subcutaneous tissue liquid extracts; concentration of solubilized proteins and other cellular products; cell debris removal; concentration of microbial suspensions (microbial harvesting); enzyme recovery; hemodialysis; removal of casein, fats and lactose from whey; concentration of albumen; separation of skimmed milk; removal of hydrocarbon oils from waste water; recovery and recycling of sewage effluent; recovery of dye stuffs from textile mill wastes; recovery of starch and proteins from factory waste, wood pulp, and paper processing; separation of carbon dioxide and methane; and catalytic chemical reactions.

As described above porous membranes can be used in a wide variety of contacting systems. In a number of applications, the porous membrane provides one or more process functions including: filtration, separation, purification, recovery of one or more components, emulsion breaking, demisting, flocculation, resistance heating and chemical reaction (catalytic or noncatalytic), e.g., pollutant destruction to a non-hazardous form.

The porous membrane, in particular the substrate, can be predominately organic or inorganic, with an inorganic substrate being suitable for demanding process environments. Depending upon the application, the copper oxide film can be provided with a barrier coating on its surface to minimize and/or reduce substantial detrimental outside environmental effects and/or conditions on the copper oxide surface. The porous organic-containing membranes often include a porous organic based polymer matrix material having incorporated therein a three dimensional copper oxide-containing material, more preferably incorporating a 1,2,3 and/or 1,2,4 material optionally a catalytic species, in an amount that provides the desired function, particularly electrical conductivity, without substantially deleteriously affecting the properties of the organic polymer matrix material. These modified polymer membranes are particularly useful in porous membrane and/or electromembrane and/or catalytic processes.

Examples of polymer materials useful in microporous membranes include cellulose esters, poly(vinyl chloride), high temperature aromatic polymers, polytetrafluoroethylene, polymers sold by E.I. DuPont Corporation under the trademark Nafion, polyethylene, polypropylene, polystyrene, polyethylene, polycarbonate, nylon, silicone rubber, and asymmetric coated polysulfone fiber. For temperatures below the Tc of the copper oxide superconductor, inorganic matrices are particularly performed because of their low temperature mechanical properties as set forth below.

A very convenient application for the coating process and products of this invention is the production of a controlled coating, e.g, a thin coating of copper oxide-containing material, on an inorganic substrate, particularly a porous inorganic substrate, to produce a porous membrane. The process provides a new generation of membranes: porous membranes for contacting processes, e.g., as described herein. The selectivity in filtration, particularly ultra and micro filtration, can also be enhanced by applying an electrical and/or magnetic field and/or an electrical potential to the porous membrane. The electrical field and/or potential can be obtained using a two electrode electrical system, the membrane including a electronically conductive copper oxide-containing coating constituting one of the two electrodes (anode or cathode).

Porous multilayer asymmetric electronically conductive inorganic membranes, produced in accordance with this invention, are particularly advantageous for membrane applications. Among the advantages of such membranes are: stability at low and high temperature and/or at large pressure gradients, mechanical stability (reduced and even substantially no compaction of the membrane under pressure), stability against microbiological attack, chemical stability especially with organic solvents, steam sterilization at high temperatures, backflush cleaning at pressures of up to 25 atm, and stability in corrosive and oxidation environment.

A membrane can be classified as a function of the size of the particles, macromolecules and molecules separated. Micron sized porous ceramics for filtration processes can be prepared through sintering of appropriate materials as set forth herein for the manufacture of sensors. However, the preferred process for membrane-based microfiltration, ultrafiltration and reverse osmosis is to provide inorganic layers with ultrafine pores and thickness small enough to obtain high flux through the membrane, particularly membranes including copper oxide-containing coatings.

With this type of asymmetric membrane, separation processes are pressure driven. Another factor is the interaction at the membrane interface between the porous material and the material to be processed. As noted above, selectivity can be enhanced by applying an electrical field onto the surface of the membrane. The electrical field is obtained using a two electrode electrical device; the conductive membrane constituting one of the two electrodes (anode or cathode—preferably anode). Such porous membranes can be obtained with one or more electronically conductive copper oxide-containing thin layers on a porous substrate. Conductive copper oxide combined with other metal oxide mixtures also provide improved properties for porous membranes and exhibit electronic conductivity, as well as other functions, such as catalysis or resistance heating.

As set forth above, porous membranes with inorganic materials can be obtained through powder agglomeration, the pores being the intergranular spaces. Conflicting requirements such as high flow rate and mechanical stability can be achieved using an asymmetric structure. Thus, an inorganic porous membrane is obtained by superimposing a thin microporous film, which has a separative function, over a thick macroporous support. For example, conductive copper oxide coating onto the surface of filter media can be used as well as onto the surface of flat circular alumina plates. Coated alumina membranes supported on the inner part of sintered alumina tubes designed for industrial ultrafiltration processes can be used. Tube-shaped supports can be used with varying different chemical compositions, such as oxides, carbides, and clays. Coating of a homogeneous and microporous copper oxide-containing layer depends on surface homogeneity of the support and on adherence between the membrane and its support. Superior results can be obtained with particulate alumina. The inner part of the tube has a membrane comprising a layer, e.g., in the range of about 10 to about 20 microns thick, with pores, e.g., having diameters in the range of about 0.02 to about 0.2 microns sized for microfiltration purposes. The main feature of such a membrane is uniform surface homogeneity allowing for the copper oxide-containing coating to be very thin, e.g., less than about one micron in thickness.

A particularly unique application that relies upon stable electronic conductivity and the physical durability of the products of this invention are dispersions of conductive material, such as powders, in fluids, e.g., hydrocarbons, e.g., mineral or synthetic oils, whereby an increase in viscosity, to even solidification, is obtained when an electrical field is applied to the system. These fluids are referred to as "field dependent" fluids which congeal and which can withstand forces of shear, tension and compression. These fluids revert to a liquid state when the electric field is turned off. Applications include dampening, e.g., shock absorbers, variable speed transmissions, clutch mechanisms, etc.

Certain of these and other aspects the present invention are set forth in the following description of the accompanying drawing.

BRIEF DESCRIPTION OF THE DRAWINGS

FIG. 1 is a block flow diagram illustrating a process for producing the present coated substrates.

DETAILED DESCRIPTION OF THE DRAWINGS

The following description specifically involves the coating of continuous copper fibers. However, it should be noted that substantially the same process steps can be used to coat other substrate forms and/or materials, particularly silver, nickel and ceramic fibers.

A process system according to the present invention, shown generally at 10, includes a preheat section 12, a coating section 14, an equilibration section 16 and an oxidation/sintering section 18. Each of these sections is in fluid communication with the others. Preferably, each of these sections is a separate processing zone or section.

First gas curtain 20 and second gas curtain 22 provide inert gas, preferably nitrogen, at the points indicated, and, thereby effectively insure that preheat section 12, coating section 14 and equilibrium section 16 are maintained in a substantially inert environment. First exhaust 24 and second exhaust 26 are provided to allow vapors to exit or be vented from process system 10.

Copper fiber, having a plurality of filaments, from substrate source 28 are fed to preheat section 12 where the mats are preheated up to a maximum of 375° C. for a time of 1 to 3 minutes at atmospheric pressure to reach thermal equilibrium. These fibers are composed of from 100 micron to 1000 micron diameter copper fibers. The fibers are individually spread up to 6 inches wide. The fibers are fed to process system 10 at the rate of about 1 to 5 feet per minute.

The preheated fibers pass to the coating section 14 where the mats are contacted with an anhydrous mixture of cuprous chloride, yttrium chloride and barium peroxide from raw material source 30. This contacting effects a coating of this mixture on the mats which will provide a 1,2, 3y, Ba, to copper oxide ratio after sintering.

This contacting may occur in a number of different ways. For example, the CuCl mixture can be combined with nitrogen to form a mist which is at a temperature of from about 25° C. to about 150° C. higher than the temperature of the fibers in the coating section 14. As this mist is brought into contact with the fibers, the temperature differential between the fibers and the mist and the amount of the mixture in the mist are such as to cause controlled amounts of CuCl, $YCl_3$ and $BaO_2$ to condense or to form and/or disperse on and coat the fibers.

Another approach is to apply the CuCl mixture in a molten form directly to the fiber tow in an inert atmosphere. There are several alternatives for continuously applying the molten mixture to the fibers. Obtaining substantially uniform distribution of the mixture on the fibers is a key objective. For example, the fibers can be compressed between two rollers that are continuously coated with the molten mixture. Another option is to spray the molten mixture onto the fibers. The fibers may also be dipped directly into the melt. The dipped fibers may be subjected to a compression roller step, a vertical lift step and/or a vacuum filtration step to remove excess molten mixture from the fibers.

Any part of process system 10 that is exposed to CuCl melt or vapor is preferably corrosion resistant.

In any event, the fibers in the coating section 14 are at a temperature of up to about 630° C., more preferably up to about 500° C. and this section is operated at slightly less than atmospheric pressure. If the CuCl coating is applied as a molten melt between compression rollers, it is preferred that such compression rollers remain in contact with the fibers for about 0.1 to about 2 minutes, more preferably about 1 to about 2 minutes.

After the CuCl coating is applied to the fibers, the fibers are passed to the equilibration section 16. Here, the coated fiber are maintained, preferably at a higher temperature than in coating section 14, in a substantially inert atmosphere for a period of time, preferably up to about 10 minutes, to allow the coating to more uniformly distribute over the fibers. In addition, if additional components are introduced onto the fibers separate from the cuprous chloride, the time the coated fiber mats spend in the equilibration section 16 results in the additional components becoming more uniformly dispersed or distributed throughout the cuprous chloride coating. Further, it is preferred that any vapor and/or liquid which separate from the coated fibers in the equilibration section 16 be transferred back and used in the coating section 14. This preferred option, illustrated schematically in FIG. 1 by lines 32 (for the vapor) and 34 (for the liquid) increases the effective overall utilization of CuCl in the process so that losses of this component, as well as other materials are reduced.

The coated fibers are passed from the equilibration zone 16 into the sintering zone 18 where such fibers are contacted with an oxidizer, such as an oxygen-containing gas, from line 36. The oxidizer preferably comprises a mixture of air and rate accelerating quantities of water vapor. This mixture, is contacted with the coated fiber mats at atmospheric pressure at a temperature of about 700° C. to about 850° C. for up to about 1 hour optionally followed by sintering at a temperature up to about 900° C. Such contacting results in converting the coating on the fiber mats to a conductive copper oxide coating. The copper oxide coated fibers product, which exits sintering section 18 via line 38, has useful electrical conductivity properties. This product preferably has a copper oxide coating having a thickness in the range of about 1 micron to about 100 microns, and is particularly useful as a component in generators and motors. Preferably, the product is substantially free of contamination or side reactions (substrate) which are detrimental to electrical conductivity.

The present process provides substantial benefits. For example, the product obtained has a copper oxide coating which has useful properties, e.g., outstanding electrical and/or morphological properties. This product may be employed in generators and motors, magnetic imaging, shields and waveguides in combination with a metallic catalyst to promote chemical reactions, or alone or in combination with other component to provide sensors. High utilization of cuprous chloride and additional components are achieved. In addition, high coating deposition and product throughput rates are obtained. Moreover, relatively mild conditions are employed. For example, temperatures within sintering section 18 can be significantly less than 950° C. The product obtained has excellent stability and durability.

EXAMPLE 1

A substrate made of yttria stabilized zirconia was contacted with a molten mixture containing CuCl, BaO$_2$ and YCl$_3$ in a ratio to provide an atomic ratio of Y, Ba, Cu of 1, 2, 3, or 1, 2, 4, in the final product. This contacting occurred at 350° C. in an argon atmosphere at about atmospheric pressure and resulted in a coating being placed on the substrate.

The coated substrate was then heated to 457° C. and allowed to stand in an argon atmosphere at about atmospheric pressure for about 20 minutes. The coated substrate was then fired at 800° C. for 20 minutes using flowing, at the rate of one (1) liter per minute, water saturated air at about atmospheric pressure.

The material was further annealed at 500° C. for 24 hours. This resulted in a substrate having a copper oxide coating with excellent electronic properties.

The present methods and products, illustrated above, provide outstanding advantages. For example, the copper oxide coated substrates, particularly thin film prepared in accordance with the present invention have improved, i.e., reduced, electronic defects, relative to substrates produced by prior methods.

EXAMPLE 2

Cuprous chloride powder is applied to multiple fibers of alumina (random mat) in the form of a powder (10 to 125 microns in average particle diameter) shaken from a powder spreading apparatus positioned 2 to about 5 feet above the spread multiple filament. An amount of YCl$_3$ and BaO$_2$ powder (10 to about 125 microns in average particle diameter) is added directly to the cuprous chloride powder to provide the necessary stoichiometry for the final copper oxide product. The powder-containing mat is placed into a coating furnace chamber at 450° C. and maintained at this temperature for approximately 20 minutes. During this time a downflow of 9.0 liters per minute of nitrogen heated to 450° C. to 500° C. is maintained in the chamber.

In the coating chamber the cuprous chloride powder melts and wicks along the fiber to form a uniform coating. The YCl$_3$ is in a finely dispersed form from about 0.2 to about 2 micron for ease of wicking. In addition, a small cloud of cuprous chloride vapor can form above the mat. This is due to a small refluxing action in which hot cuprous chloride vapors rise slightly and are then forced back down into the mat for coating and distribution by the nitrogen downflow. This wicking and/or refluxing is believed to aid in the uniform distribution of cuprous chloride and additional components in the coating chamber.

The fiber is then moved into the oxidation chamber. The oxidation step occurs in a molecular oxygen-containing atmosphere at a temperature of 800° C. for a period of time of 1 hour. The fiber may be coated by this process more than once to achieve thicker coatings and/or removed and annealed in a finishing oxidation step to develop the optimum crystal structure for conductivity.

EXAMPLE 3

Example 2 is repeated except that the powder is applied to the mat using a powder sprayer which includes a canister for fluidizing the powder and provides for direct injection of the powder into a spray gun. The powder is then sprayed directly on the mat, resulting in a highly uniform powder distribution.

EXAMPLE 4

Example 2 is repeated except that the powder is applied to the fiber by pulling the mat through a fluidized bed of the powder, which as an average particle diameter of about 5 to about 125 microns for meltable components and from about 0.2 to about 2 micron for dispersible compounds.

EXAMPLE 5 to 7

Examples 2, 3 and 4 are repeated except that, prior to contacting with the powder, the mat is charged by passing electrostatically charged air over the mat. The powder particles are charged with an opposite charge to that of the mat. The use of oppositely charged mat and powder acts to assist or enhance the adherence of the powder to the mat.

EXAMPLES 8 TO 13

In each of the Examples 2 to 7, the final coated mat includes an effective copper oxide-containing coating having a substantial degree of uniformity.

While this invention has been described with respect to various specific examples and embodiments, it is to be understood that the invention is not limited thereto and that it can be variously practiced within the scope of the following claims.

What is claimed is:

1. A process for coating an inorganic three dimensional substrate with copper oxide comprising:

contacting an inorganic three dimensional substrate which includes external surfaces and shielded surfaces which are at least partially shielded by other portions of said substrate with a composition comprising a copper oxide forming compound other than copper oxide at conditions effective to form a copper chloride-forming compound containing coating on at least a portion of said substrate;

forming a liquidus copper oxide forming compound containing coating on at least a portion of the three dimensions of said substrate including the shielded surfaces of said substrate;

contacting said substrate with at least one additional magnetic or conductivity interacting component at conditions effective to form a component-containing coating on at least a portion of said substrate including at least a portion of the three dimensions of said substrate including the shielded surfaces of said substrate; said contacting being initiated at least prior to the substantially complete oxidation of said copper oxide forming compound to copper oxide; and contacting said substrate having said copper oxide forming compound containing coating and said additional component-containing coating thereon with an oxidizing agent at conditions effective to convert said copper oxide forming compound to copper oxide and form copper oxide coating with the additional magnetic or conductivity interacting component on at least a portion of said three dimensions of said substrate including the shielded surfaces of said substrate.

2. The process of claim 1 wherein said copper oxide forming compound is selected from the group consisting of copper chloride, low molecular weight copper organic salts, low molecular weight copper organic complexes and mixtures thereof.

3. The process of claim 1 wherein said copper oxide forming compound is cuprous chloride.

4. The process of claim 1 wherein said additional conductivity interacting component is an oxide precursor selected from the group consisting of yttrium, barium, calcium, thallium and conductivity interacting mixtures.

5. The process of claim 1 wherein said additional conductivity interacting component is an oxide precursor selected from the group consisting of yttrium and barium conductivity interacting mixture in a mole ratio with copper oxide of about 1 to about 2 to about 3 up to about 4 and thallium, barium, calcium in a mole ratio with copper of about 1, to about 1, to about 1 to about 2 up to about 3.

6. The process of claim 1 wherein said substrate is maintained for a period of time at conditions effective to do at least one of the following: (1) coat a larger portion of said substrate with said copper oxide forming compound: (2) distribute said copper oxide forming compound over said substrate; (3) make said copper oxide forming compound-containing coating more uniform in thickness; (4) incorporate said additional conductivity interacting component in said copper oxide forming compound coating; and (5) distribute said additional conductivity interacting component more uniformly in said copper oxide forming compound containing coating.

7. The process of claim 1 wherein said substrate is in a form selected from the group consisting of spheres extrudates, flakes, fibers, fiber rovings, chopped fibers, fiber mats, porous substrates, irregularly shaped particles, tubes and multi-channel monoliths.

8. The process of claim 7 where in substrate is a material selected from the group consisting of copper, silver, nickel and a ceramic oxide.

9. A process for coating an inorganic three dimensional substrate with copper oxide comprising:

contacting an inorganic three dimensional substrate which includes external surfaces and shielded portions of said substrate with a composition comprising a copper chloride-forming compound at conditions effective to form a copper chloride-forming compound containing coating on at least a portion of said substrate;

forming a liquidus copper chloride-forming compound containing coating on at least a portion of the three dimensions of said substrate including the shielded surfaces of said substrate and at conditions effective to do at least one of the following: (1) coat a larger portion of said substrate with said copper chloride-forming compound; (2) distribute said copper chloride-forming compound over said substrate; and (3) make said copper chloride-forming compound containing coating more uniform in thickness; and contacting said substrate with said copper chloride-forming compound containing coating with an oxidizing agent at conditions effective to convert the copper chloride forming compound to copper oxide and form a copper oxide coating on at least a portion of said three dimensions of said substrate including the shielded surfaces of said substrate.

10. The process of claim 9 which further comprises contacting said substrate with an additional magnetic or conductivity interacting component at conditions effective to form an additional component containing coating on said substrate, said additional component contacting occurring prior to substantially complete oxidation of said copper chloride forming compound to the oxide.

11. The process of claim 10 wherein said substrate s in a form selected from the group consisting of spheres, extrudates, flakes, fibers, fiber rovings, chopper fibers, fiber mats, porous substrates, irregularly shaped particles, tubes and multi-channel monoliths.

12. The process of claim 11 where in substrate is a material selected from the group consisting of copper, silver, nickel and a ceramic oxide.

13. The process of claim 9 wherein any one or more of said contacting steps and said is conducted under gas fluidizing conditions.

14. A process for coating surfaces of an inorganic three dimensional substrate with copper oxide which comprises: contacting an inorganic three dimensional substrate with a composition comprising a copper oxide precursor powder other than copper oxide at conditions effective to form a coating containing copper oxide precursor on at least a portion of the substrate; forming a liquidus copper oxide precursor on at least a portion of the three dimensions of said substrate including the shielded surfaces of said substrate and at conditions effective to do at least one of the following: (1) coat a larger portion of said substrate with said coating containing copper oxide precursor; (2) distribute said coating containing copper oxide precursor over said substrate; and (3) make said coating containing copper oxide precursor more uniform in thickness; and contacting said coated substrate with an oxidizing agent at conditions effective to convert said copper oxide precursor to copper oxide on at least a portion of said three dimensions of said substrate and form a substrate having a copper oxide-containing coating.

15. The process of claim 14 which further comprises contacting said substrate with a additional magnetic or conductivity interacting component at conditions effective to form a additional component containing coating on said substrate, said additional component contacting occurring prior to the substantially complete oxidation of said copper oxide precursor to copper oxide.

16. The process of claim 14 wherein said copper oxide forming component is selected from the group consisting of copper chloride, low molecular weight copper organic salts, low molecular weight copper organic complexes and mixtures thereof.

17. The process of claim 14 wherein said copper oxide forming compound is cuprous chloride.

18. The process of claim 15 wherein said additional component is an additional oxide precursor selected from the group consisting of yttrium, barium, calcium, thallium and conductivity interacting mixtures thereof.

19. The process of claim 16 wherein said additional component is an additional oxide precursor selected from the group consisting of yttrium, barium, calcium, thallium and conductivity interacting mixtures thereof.

20. The process of claim 14 wherein any one or more of said contacting steps and said forming step is conducted under gas fluidizing conditions.

21. The process of claim 14 wherein said substrate is contacted with a film forming amount of said copper oxide precursor powder.

22. The process of claim 1 wherein said substrate is selected from the group consisting of spheres, extrudates, flakes, fibers, wires, porous substrates, tubes, and irregularly shaped particles.

23. The process of claim 2 wherein any one or more of said contacting steps and forming step is conducted under gas fluidizing conditions.

24. The process of claim 10 wherein said copper chloride forming compound is cuprous chloride.

25. The process of claim 24 wherein said substrate is in a form selected from the group consisting of spheres, extrudates, fibers, wires, tubes, flakes, porous substrates, and irregularly shaped particles.

26. The process of claim 9 wherein said copper chloride forming compound contacting the substrate is in a solid state.

27. The process of claim 14 wherein said substrate is selected from the group consisting of spheres, extrudates, tubes, flakes, fibers, wires, porous substrates, and irregularly shaped particles.

* * * * *